United States Patent
Tsuji et al.

(10) Patent No.: US 9,748,313 B2
(45) Date of Patent: Aug. 29, 2017

(54) ORGANIC ELECTROLUMINESCENT ELEMENT

(71) Applicant: PANASONIC INTELLECTUAL PROPERTY MANAGEMENT CO., LTD., Osaka (JP)

(72) Inventors: Hiroya Tsuji, Kyoto (JP); Kazuyuki Yamae, Nara (JP); Satoshi Ohara, Tokyo (JP); Varutt Kittichungchit, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/891,505

(22) PCT Filed: May 15, 2014

(86) PCT No.: PCT/JP2014/002557
§ 371 (c)(1),
(2) Date: Nov. 17, 2015

(87) PCT Pub. No.: WO2014/185075
PCT Pub. Date: Nov. 20, 2014

(65) Prior Publication Data
US 2016/0104749 A1    Apr. 14, 2016

(30) Foreign Application Priority Data
May 17, 2013   (JP) .................................. 2013-105219

(51) Int. Cl.
*H01L 27/32*    (2006.01)
*H01L 51/50*    (2006.01)
(Continued)

(52) U.S. Cl.
CPC .......... *H01L 27/3209* (2013.01); *C09K 11/06* (2013.01); *H01L 51/5016* (2013.01);
(Continued)

(58) Field of Classification Search
CPC . H01L 51/006; H01L 51/005; H01L 51/0058; H01L 51/0085; H01L 51/5016; H01L 51/5044; H01L 27/3209
See application file for complete search history.

(56) References Cited

U.S. PATENT DOCUMENTS

2005/0134174 A1    6/2005    Shiratori et al.
2005/0206305 A1    9/2005    Masuda et al.
(Continued)

FOREIGN PATENT DOCUMENTS

CN    101331578 A    12/2008
JP    2004-006165 A    1/2004
(Continued)

OTHER PUBLICATIONS

Machine Translation of JP2009-224274 A (Sasaki et al) (dated Oct. 1, 2009), 20 pages.*
(Continued)

*Primary Examiner* — Caridad Everhart
(74) *Attorney, Agent, or Firm* — Greenblum & Bernstein, P.L.C.

(57) ABSTRACT

The objective is to provide an organic electroluminescent element with an improved luminous efficiency. The organic electroluminescent element has a structure in which a first light-emitting unit containing a phosphorescent red light-emitting material, a second light-emitting unit containing a phosphorescent yellow light-emitting material, and a third light-emitting unit containing a fluorescent blue light-emitting material are stacked with interlayers in-between. A peak emission wavelength of the phosphorescent yellow light-
(Continued)

emitting material is in a range of 530 nm to 570 nm. A peak emission wavelength of the fluorescent blue light-emitting material is in a range of 440 nm to 480 nm. The organic electroluminescent element has a ratio of a yellow emission intensity to a blue emission intensity in a range of 1.0 to 2.0. The organic electroluminescent element further has a ratio of a red emission intensity to the blue emission intensity in a range of 1.5 to 3.0.

4 Claims, 3 Drawing Sheets

(51) Int. Cl.
    *C09K 11/06*           (2006.01)
    *H01L 51/00*           (2006.01)

(52) U.S. Cl.
    CPC ...... *H01L 51/5044* (2013.01); *C09K 2211/10* (2013.01); *C09K 2211/1011* (2013.01); *C09K 2211/1029* (2013.01); *C09K 2211/1088* (2013.01); *C09K 2211/185* (2013.01); *H01L 51/005* (2013.01); *H01L 51/006* (2013.01); *H01L 51/0058* (2013.01); *H01L 51/0085* (2013.01)

(56) References Cited

U.S. PATENT DOCUMENTS

| | | |
|---|---|---|
| 2006/0145123 A1 | 7/2006 | Li |
| 2006/0232194 A1 | 10/2006 | Tung et al. |
| 2009/0091252 A1 | 4/2009 | Kosuge et al. |
| 2009/0230415 A1* | 9/2009 | Ide ..................... H01L 27/3209 257/98 |
| 2009/0230844 A1 | 9/2009 | Pfeiffer et al. |
| 2010/0176380 A1* | 7/2010 | Jung ..................... C07D 213/30 257/40 |
| 2011/0278558 A1 | 11/2011 | Hamada |
| 2012/0037896 A1* | 2/2012 | Kaiser .................. C09B 57/008 257/40 |
| 2012/0061657 A1 | 3/2012 | Kosuge et al. |
| 2012/0074392 A1 | 3/2012 | Huang et al. |
| 2014/0084269 A1* | 3/2014 | Weaver ............... H01L 51/5262 257/40 |
| 2015/0171356 A1* | 6/2015 | Nakamura ............. C09K 11/06 257/40 |

FOREIGN PATENT DOCUMENTS

| | | |
|---|---|---|
| JP | 2005-183213 | 7/2005 |
| JP | 2005-267990 | 9/2005 |
| JP | 2006-041395 | 2/2006 |
| JP | 2006-324016 | 11/2006 |
| JP | 2009-084256 | 4/2009 |
| JP | 2009-224274 | 10/2009 |
| JP | 2011-243979 | 12/2011 |
| WO | 2007056311 A2 | 5/2007 |

OTHER PUBLICATIONS

Search Report issued by WIPO patent office in WIPO Patent Application No. PCT/JP2014/002557, dated Aug. 19, 2014.

Office Action issued in Germany family member Patent Appl. No. 112014002453.8, dated Oct. 4, 2016, along with an English translation thereof.

Office Action issued in China patent family Patent Appl. No. 201480028644.X, dated Mar. 16, 2017, along with an English translation thereof.

* cited by examiner

ORGANIC ELECTROLUMINESCENT ELEMENT

TECHNICAL FIELD

The present invention relates to organic electroluminescent elements, and more specifically to an organic electroluminescent element (hereinafter referred to as "organic EL element" if needed) suitable for use in lighting devices and others.

BACKGROUND ART

In the past, there has been known an organic EL element which includes a stack in which an organic light-emitting layer is between a pair of electrodes. In this organic EL element, the organic light-emitting layer produces light when electrons and holes are recombined inside the organic light-emitting layer. Further, there has been known another organic EL element having a multi-unit structure which includes multiple light-emitting units (for example, see Patent Literature 1 to 3).

Patent literature 1 relates to an organic EL element in which multiple light-emitting units are connected in series, and discloses a method for obtaining light with desired chromaticity by mixing light from the multiple light-emitting units. In this organic EL element, to realize the white light emission, two or more fluorescent light-emitting units are provided with regard to one phosphorescent light-emitting unit. With this method, although the desired chromaticity can be easily realized, the total luminous efficiency tends to decrease because the fluorescent light-emitting units whose luminous efficiency is lower than that of the phosphorescent light-emitting unit are stacked. Thus, there has been a need for improvement in terms of the luminous efficiency.

Moreover, patent literature 2 discloses a method for obtaining an organic light-emitting element with a high luminous efficiency by stacking a multi-color light-emitting unit and a monochromatic light-emitting unit whose luminous efficiency is lower than that of the multi-color light-emitting unit. Specifically, to realize high luminous efficiency, a stacked structure of a fluorescent red light-emitting unit and a fluorescent blue-green light-emitting unit, or a stacked structure of a fluorescent blue light-emitting unit and a phosphorescent green-red light-emitting unit is used. However, in consideration of lighting use, the former is a double layer structure of fluorescent light-emitting units, and is lower in the luminous efficiency than a structure including phosphorescent light-emitting units. The latter is a structure of which a green light-emitting layer and a red light-emitting layer are stacked in the unit, and a driving voltage of the unit is likely to be affected by green light emission corresponding to a large band gap. Therefore, compared with a red monochromatic light-emitting unit, the driving voltage is relatively high, and as a result the luminous efficiency becomes low.

Patent literature 3 discloses a structure for suppressing change with time in color by adopting a structure in which a first light-emitting unit including multiple organic light-emitting layers and a second light-emitting unit including an organic light-emitting layer with a single layer structure are stacked. As a white element including a two-unit structure, (1) a stack of a fluorescent light-emitting unit and a fluorescent light-emitting unit, (2) a stack of the fluorescent light-emitting unit and a phosphorescent light-emitting unit, (3) a stack of the phosphorescent light-emitting unit and the phosphorescent light-emitting unit, and the like are considered. However, the aforementioned (1) is the lowest in the luminous efficiency. The aforementioned (3) requires a blue phosphorescent material and therefore it may leave a big problem on a lifetime. The aforementioned (2) is a structure which is good in both the luminous efficiency and the lifetime, but it also may leave a problem on the luminous efficiency because the fluorescent light-emitting units and the phosphorescent light-emitting units are stacked at the number ratio of 1:1 and an advantageous feature of the phosphorescent light-emitting unit with high luminous efficiency cannot be sufficiently utilized.

CITATION LIST

Patent Literature

Patent Literature 1: JP 2005-183213 A
Patent Literature 2: JP 2005-267990 A
Patent Literature 3: JP 2006-324016 A

SUMMARY OF INVENTION

Technical Problem

In view of the above insufficiency, the present invention has aimed to propose an organic electroluminescent element having an improved luminous efficiency.

Solutions to Problem

An organic electroluminescent element according to the present invention has a structure in which a first light-emitting unit containing a phosphorescent red light-emitting material, a second light-emitting unit containing a phosphorescent yellow light-emitting material, and a third light-emitting unit containing a fluorescent blue light-emitting material are stacked with interlayers in-between. A peak emission wavelength of the phosphorescent yellow light-emitting material is in a range of 530 nm to 570 nm, and a peak emission wavelength of the fluorescent blue light-emitting material is in a range of 440 nm to 480 nm. The organic electroluminescent element has a ratio of a yellow emission intensity to a blue emission intensity in a range of 1.0 to 2.0, and the organic electroluminescent element further has a ratio of a red emission intensity to the blue emission intensity in a range of 1.5 to 3.0.

Advantageous Effects of Invention

The present invention can realize high luminous efficiency of the organic electroluminescent element.

DESCRIPTION OF EMBODIMENTS

The embodiments of the present invention will be described below.

First Embodiment

Figure 1:
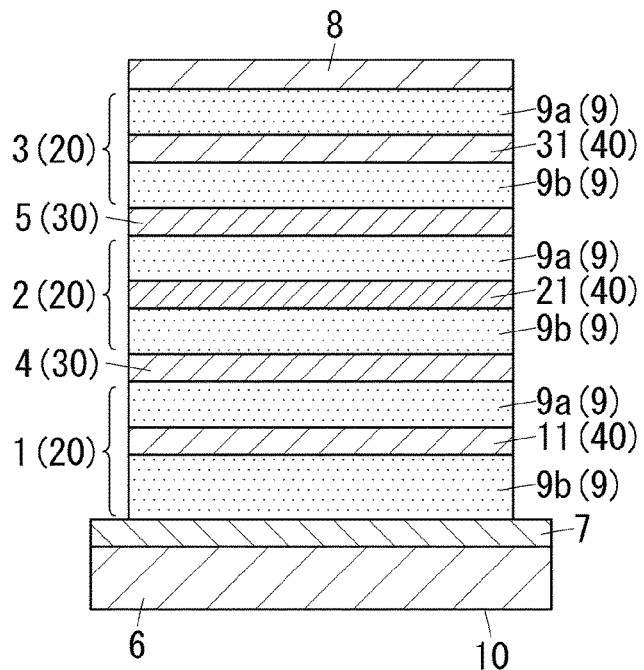
FIG. 1 is a schematic sectional view illustrating an example of an embodiment of the present invention.

FIG. 1 shows an example of an organic EL element 10 of the first embodiment. The organic EL element 10 has a multi-unit structure including multiple light-emitting units 20. The multi-unit structure is a structure in which multiple light-emitting units 20 stacked in thickness direction are arranged so as to be connected electrically in series between an anode and a cathode. The organic EL element 10 has a triple-unit structure that includes a first light-emitting unit 1, a second light-emitting unit 2, and a third light-emitting unit 3 as the light-emitting units 20. The organic EL element 10 may include two or more further light-emitting units in addition to the first light-emitting unit 1, the second light-emitting unit 2, and the third light-emitting unit 3.

The organic EL element 10 further includes interlayers 30, a substrate 6, a first electrode 7, and a second electrode 8. Each interlayer 30 is interposed between adjacent light-emitting units 20. A first interlayer 4 which is one of the interlayers 30 is interposed between the first light-emitting unit 1 and the second light-emitting unit 2, and a second interlayer 5 which is the other of the interlayers 30 is interposed between the second light-emitting unit 2 and the third light-emitting unit 3. The first electrode 7 is interposed between the substrate 6 and the first light-emitting unit 1. The second electrode 8 is disposed on an external surface (an opposite surface from the second interlayer 5) of the third light-emitting unit 3.

In the organic EL element 10, the substrate 6, the first electrode 7, the first light-emitting unit 1, the first interlayer 4, the second light-emitting unit 2, the second interlayer 5, the third light-emitting unit 3, and the second electrode 8 are stacked in this order.

Each light-emitting unit 20 includes one or more light-emitting layers 40, and has a layered structure for allowing the one or more light-emitting layers 40 to emit light when voltage is applied between an anode and a cathode which hold the one or more light-emitting layers 40 therebetween. Hereinafter, this layered structure is referred to as an "organic EL layer", if needed. To obtain desired light emission, a thickness of the light-emitting layer 40 is preferably equal to or more than 1 nm, is more preferably equal to or more than 5 nm, and is further preferably equal to or more than 7 nm. Further, in view of the luminous efficiency and the like, the thickness of the light-emitting layer 40 is preferably equal to or less than 100 nm, is more preferably equal to or less than 50 nm, and is further preferably equal to or less than 40 nm.

The light-emitting layer 40 may be composed of a light-emitting dopant (light-emitting material) and a host serving as a medium receiving the light-emitting dopant. The light-emitting dopant may be selected from a phosphorescent light-emitting material, a fluorescent light-emitting material and the like. The organic EL element 10 is formed so that the first light-emitting unit 1 includes a red light-emitting layer 11 containing a phosphorescent red light-emitting material. The red light-emitting layer 11 may contain a fluorescent red light-emitting material in addition to the phosphorescent red light-emitting material. It is preferable that the percentage of an amount of the phosphorescent red light-emitting material to a total amount of light emitting materials contained in the red light-emitting layer 11 be in a range of 50% to 100% by mass.

The organic EL element 10 is further formed so that the second light-emitting unit 2 includes a yellow light-emitting layer 21 containing a phosphorescent yellow light-emitting material. The yellow light-emitting layer 21 may contain a fluorescent yellow light-emitting material in addition to the phosphorescent yellow light-emitting material. It is preferable that the percentage of an amount of the phosphorescent yellow light-emitting material to a total amount of light-emitting materials contained in the yellow light-emitting layer 21 be in a range of 50% to 100% by mass.

The organic EL element 10 is further formed so that the third light-emitting unit 3 includes a blue light-emitting layer 31 containing a fluorescent blue light-emitting material. The blue light-emitting layer 31 may contain a phosphorescent blue light-emitting material in addition to the fluorescent blue light-emitting material. It is preferable that the percentage of an amount of the fluorescent blue light-emitting material to a total amount of light-emitting materials contained in the blue light-emitting layer 31 be in a range of 50% to 100% by mass.

In this manner, the organic EL element 10 includes a combination of one light-emitting unit 20 that emits light by fluorescence and two light-emitting units 20 that emit light by phosphorescence. Therefore this organic EL element 10 is greater in a ratio of light by phosphorescence than the organic EL element 10 including a combination of one light-emitting unit 20 that emits light by fluorescence and one light-emitting unit 20 that emits light by phosphorescence. Thus, the former organic EL element 10 has an improved luminous efficiency. That is, the fluorescent light-emitting material generally requires more energy in order to emit light than the phosphorescent light-emitting material. Therefore, when the light-emitting units 20 containing the phosphorescent light-emitting material is greater in number than the light-emitting units 20 containing the fluorescent light-emitting material, an efficiency of light emission to supplied energy can be improved and the voltage reduction can be facilitated. The light-emitting material (a dopant) may further include one or more dopants which are not categorized into the phosphorescent material and the fluorescence material. For example, in the past, there have been developed light-emitting materials which emit light by energy transition from a phosphorescent energy level to a fluorescent energy level, and one or more of such light-emitting materials may be used additionally. Further, in order to improve the luminous efficiency of the organic EL element 10, it is preferable to increase an amount of phosphorescent light-emitting materials used as blue light-emitting materials. However, the phosphorescent blue light-emitting material has short-lifetime, and in many cases such a phosphorescent blue light-emitting material cannot produce light having a desired emission wavelength, and therefore the fluorescent blue light-emitting material can be used rather than the phosphorescent blue light-emitting material.

In a similar manner to the above organic EL element 10, the triple unit structure may be configured so that the red light-emitting layer 11 containing the phosphorescent red light-emitting material smallest in energy necessary for light emission is not direct contact with the yellow light-emitting layer 21 containing the phosphorescent yellow light-emitting material larger in energy necessary for light emission or the blue light-emitting layer 31 containing the fluorescent blue light-emitting material. The organic EL element having such a triple unit structure can operate with low voltage.

In the organic EL element 10, a peak emission wavelength of an emission spectrum of the phosphorescent yellow light-emitting material contained in the second light-emitting unit 2 is in a range of 530 nm to 570 nm, and a peak emission wavelength of an emission spectrum of the fluorescent blue light-emitting material contained in the third light-emitting unit 3 is in a range of 440 nm to 480 nm. Use of the phosphorescent yellow light-emitting material and the fluorescent blue light-emitting material individually having the aforementioned peak emission wavelengths enables white light emission even when the luminous efficiency of red, yellow, and blue is not reduced purposefully. The phosphorescent light-emitting material is considered to have an internal quantum efficiency of 100% and the fluorescent light-emitting material is considered to have an internal quantum efficiency of 25%. It is considered that the fluorescent light-emitting material for causing a TTF phenomenon described in WO 2010/134252 A1 has an internal quantum efficiency of up to 62.5%. When any of the phosphorescent yellow light-emitting material and the fluorescent blue light-emitting material individually having the peak emission wavelengths not falling within the aforementioned ranges is used, white light emission cannot be realized unless the luminous efficiency of the phosphorescent yellow light-emitting material with a higher internal quantum efficiency is purposefully reduced by: making it of material with poor properties; not optimizing mixture concentrations of light-emitting materials; designing a structure to cause a career imbalance; and/or the like. For example, Ir(ppy)$_3$ which is generally used as the phosphorescent yellow light-emitting material has a peak emission wavelength of around 515 nm, and the triple unit structure formed of substances containing this material tends to give light not falling within a white region.

Hence, the phosphorescent yellow light-emitting material whose peak emission wavelength is in the range of 530 nm to 570 nm, and the fluorescent blue light-emitting material whose peak emission wavelength is in the range of 440 nm to 480 nm are used in the organic EL element 10. Due to this, the degree of freedom in selecting the phosphorescent red light-emitting material to be used for the organic EL element 10 can be improved. In other words, due to the use of the phosphorescent yellow light-emitting material and the fluorescent blue light-emitting material individually having the peak emission wavelengths falling within the aforementioned ranges, it is possible that a peak emission wavelength of the phosphorescent red light-emitting material does not give a large influence on the realization of white light emission. Note that, in the present embodiment, it is preferable that a peak emission wavelength of an emission spectrum of the phosphorescent red light-emitting material is in a range of 590 nm to 650 nm. In the present embodiment, "white light emission" means a light emission within a white region described in the ENERGY STAR® Program Requirements for Solid State Lighting Luminaires.

Figure 2:
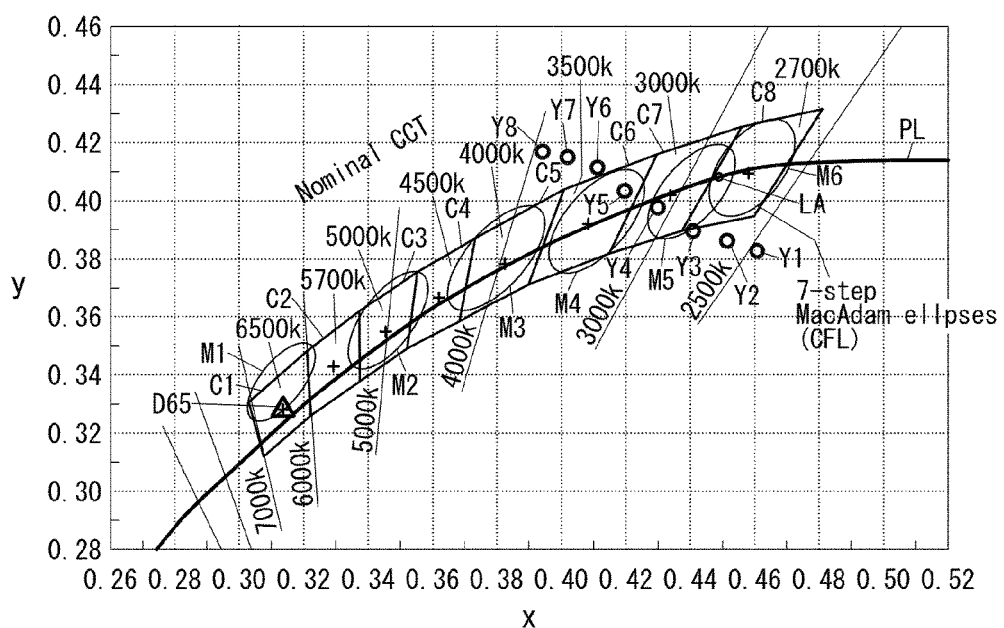
FIG. 2 is a chromaticity diagram showing chromaticity of organic EL elements containing yellow light-emitting materials with different peak emission wavelengths.
Figure 3:
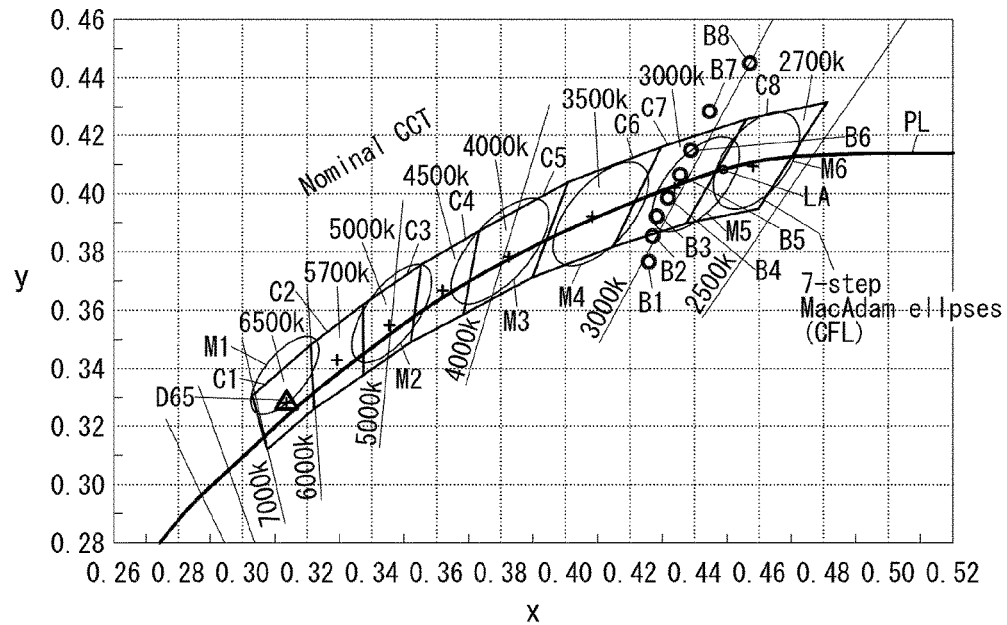
FIG. 3 is a chromaticity diagram showing chromaticity of organic EL elements containing blue light-emitting materials with different peak emission wavelengths.
Figure 4:
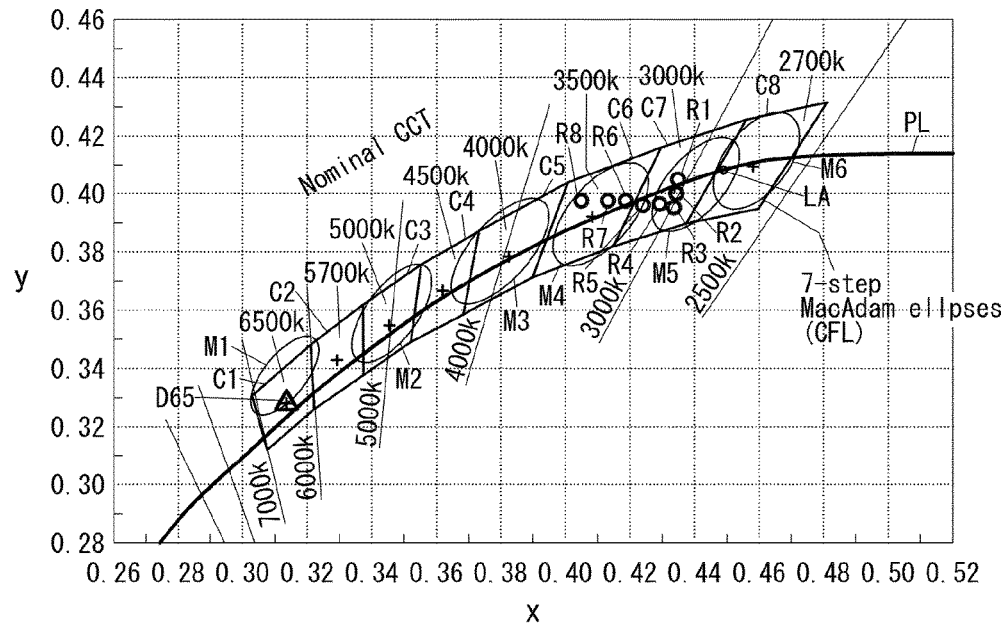
FIG. 4 is a chromaticity diagram showing chromaticity of organic EL elements containing red light-emitting materials with different peak emission wavelengths.

FIG. 2, FIG. 3, and FIG. 4 each show a part of a chromaticity diagram of CIE1931. The curve PL denotes the Plank locus. The quadrangles C1 to C8 denote ANCI quadrangles corresponding to correlated color temperatures from 6500 K to 2700 K. The ellipses M1 to M6 denote MacAdam ellipses. The sign LA denotes a standard illuminant A. The sign D65 denotes a standard illuminant D65.

In FIG. 2, the signs Y1 to Y8 denote chromaticity of light emitted from organic EL elements 10 containing yellow light-emitting materials with different peak emission wavelengths. Y1 denotes chromaticity of light emitted from the organic EL element 10 containing the yellow light-emitting material which has the longest peak emission wavelength. Y8 denotes chromaticity of light emitted from the organic EL element 10 containing the yellow light-emitting material which has the shortest peak emission wavelength. The organic EL elements 10 are formed by use of the yellow light-emitting materials of different peak emission wavelengths so that the order of Y2, Y3, Y4, Y5, Y6, and Y7 is in a descending order of the peak emission wavelength. In this case, these organic EL elements 10 are the same in components (such as the red light-emitting material and the blue light-emitting material) other than the yellow light-emitting material.

In FIG. 3, the signs B1 to B8 denote chromaticity of light emitted from organic EL elements 10 containing blue light-emitting materials of different peak emission wavelengths. B1 denotes chromaticity of light emitted from the organic EL element 10 containing the blue light-emitting material which has the shortest peak emission wavelength. B8 denotes chromaticity of light emitted from the organic EL element 10 containing the blue light-emitting material which has the longest peak emission wavelength. The organic EL elements 10 are formed by use of the blue light-emitting materials of different peak emission wavelengths so that the order of B2, B3, B4, B5, B6, and B7 is in an ascending order of the peak emission wavelength. In this case, these organic EL elements 10 are the same in components (such as the red light-emitting material and the yellow light-emitting material) other than the blue light-emitting material.

In configuring the organic EL element 10 to emit white light, it is preferable that the chromaticity of such white light is within regions of quadrangles C1 to C8. Accordingly, as for FIG. 2, it is preferable to select the peak emission wavelength of the yellow light-emitting material so that the organic EL element 10 offers any of chromaticity Y3 to Y5. Further, as for FIG. 3, it is preferable to select the peak emission wavelength of the blue light-emitting material so that the organic EL element 10 offers any of chromaticity B3 to B6. As a result of selecting the peak emission wavelengths of the yellow light-emitting material and the blue light-emitting material in the aforementioned manner, the red light-emitting material can be selected from many candidates with different peak emission wavelengths. In FIG. 4, the signs R1 to R8 denote chromaticity of light emitted from organic EL elements containing red light-emitting material with different peak emission wavelengths. R1 denotes chromaticity of light emitted from the organic EL element 10 containing the red light-emitting material which has the shortest peak emission wavelength. R8 denotes chromaticity of light emitted from the organic EL element 10 containing the red light-emitting material which has the longest peak emission wavelength. The organic EL elements 10 are formed by use of the red light-emitting materials of different peak emission wavelengths so that the order of R2, R3, R4, R5, R6, and R7 is in an ascending order of the peak emission wavelength. In this case, these organic EL elements 10 are the same in components (such as the blue light-emitting material and the yellow light-emitting material) other than the red light-emitting material. As shown in FIG. 4, when the organic EL elements 10 are formed by use of the red light-emitting materials with different peak emission wavelengths, almost all of such organic EL elements 10 emit light showing chromaticity within regions of quadrangles C1 to C8. Accordingly, it is possible to select the red light-emitting material from many candidates with different peak emission wavelengths, and thus the degree of freedom in selecting the red light-emitting material can be improved.

The peak emission wavelength of the phosphorescent yellow light-emitting material may be in the range of 530 nm to 570 nm, and is preferably in a range of 540 nm to 570 nm, and is more preferably in a range of 550 nm to 570 nm. In such cases, it is possible to more easily form the organic EL element 10 which emits white light with chromaticity closer to a black body radiation locus (the Plank locus, a black body locus). Further, the peak emission wavelength of the fluorescent blue light-emitting material may be in the range of 440 nm to 480 nm, and is preferably in a range of 440 nm to 470 nm, and is more preferably in a range of 440 nm to 460 nm. In such cases, it is possible to more easily form the organic EL element 10 which emits white light with chromaticity closer to the black body radiation locus.

In the organic EL element 10, an emission color formed by mixing three emission colors of red, yellow, and blue depends on integrals of emission spectrums of light-emitting materials. By achieving a desired ratio of the integrals, the organic EL element 10 with a white light emission can be realized easily. The organic EL element 10 has a ratio of a yellow emission intensity to a blue emission intensity in a range of 1.0 to 2.0, and has a ratio of a red emission intensity to the blue emission intensity in a range of 1.5 to 3.0. The ratio of the yellow emission intensity to the blue emission intensity is a value obtained by dividing an emission peak intensity of an emission region (a region of a wavelength from 530 nm to 570 nm) of the yellow light-emitting material by an emission peak intensity of an emission region (a region of a wavelength from 440 nm to 480 nm) of the blue light-emitting material in terms of a white emission spectrum of the organic EL element 10. Similarly, the ratio of the red emission intensity to the blue emission intensity is a value obtained by dividing an emission peak intensity of an emission region (a region of a wavelength from 590 nm to 650 nm) of the red light-emitting material by the emission peak intensity of the emission region of the blue light-emitting material in terms of white emission spectrum of the organic EL element 10. In a case of using only the phosphorescent yellow light-emitting material as the yellow light-emitting material, the ratio of the yellow emission intensity to the blue emission intensity is considered a ratio of a phosphorescent yellow emission intensity to the blue emission intensity. In a case of using only the phosphorescent red light-emitting material as the red light-emitting material, the ratio of the red emission intensity to the blue emission intensity is considered a ratio of a phosphorescent red emission intensity to a fluorescent blue emission intensity.

The organic EL element 10 can provide white light emission which is suitable for lighting applications so long as the ratio of the yellow emission intensity to the blue emission intensity is in the range of 1.0 to 2.0. When the ratio of the yellow emission intensity to the blue emission intensity is preferably in a range of 1.0 to 1.9, and more preferably in a range of 1.0 to 1.8, it is possible to easily realize the organic EL element 10 with white light emission with a higher color rendering property. Further the organic EL element 10 can provide white light emission which is suitable for lighting applications so long as the ratio of the red emission intensity to the blue emission intensity is in the range of 1.5 to 3.0. When the ratio of the red emission intensity to the blue emission intensity is preferably in a range of 1.5 to 2.8, and more preferably in a range of 1.5 to 2.6, it is possible to easily realize the organic EL element 10 with white light emission with a higher color rendering property.

The yellow emission intensity may change according to types and usage (concentration) and the like of the yellow light-emitting material. The red emission intensity may change according to types and usage (concentration) and the like of the red light-emitting material. The blue emission intensity may change according to types and usage (concentration) and the like of the blue light-emitting material. Accordingly, it is possible to set the ratio of the yellow emission intensity to the blue emission intensity and the ratio of the red emission intensity to the blue emission intensity to be in the above prescribed ranges by appropriately selecting types and usage of light-emitting materials.

In the organic EL element 10, it is preferable that the red light-emitting layer 11 of the first light-emitting unit 1 contains only the phosphorescent red light-emitting material as the light-emitting dopant. The organic EL element 10 can be easily driven with low voltage by containing, as the light-emitting dopant, only the red light-emitting material that is the smallest, in energy necessary for emitting light, of the red, yellow, and blue light-emitting materials. For example, the amount of energy required for emitting 600 nm red light is obtained as 1,240/600=2.1 eV, the amount of energy required for emitting 530 nm yellow light is obtained as 1,240/530=2.3 eV, and the amount of energy required for emitting 450 nm blue light is obtained as 1,240/450=2.8 eV. Thus, the light-emitting unit 20 of the red-single color can be driven with the lowest voltage. Note that, the relationship between the energy and the wavelength can be represented by a formula of $E=Hv=hc/\lambda \approx 1,240/\lambda$ (the value obtained by multiplying h: Planck's constant by c: the velocity of light is almost equal to 1,240). If the yellow light-emitting material or the blue light-emitting material is mixed in the red light-emitting layer 11, the energy required for emitting light of the red light-emitting layer 11 may be affected by the yellow light-emitting material or the blue light-emitting material that require higher energy for emitting light, and therefore the driven voltage of the red light-emitting layer 11 is likely to increase.

In the organic EL element 10, it is preferable that at least one of the first light-emitting unit 1 and the second light-emitting unit 2 contains an energy transfer facilitating material for facilitating transfer of energy to the light-emitting material. That is, the energy transfer facilitating material may be contained only in the first light-emitting unit 1, or may be contained only in the second light-emitting unit 2, or may be contained in both the first light-emitting unit 1 and the second light-emitting unit 2. To contain the energy transfer facilitating material in the first light-emitting unit 1, the energy transfer facilitating material can be mixed in the red light-emitting layer 11. Otherwise, the energy transfer facilitating material can be contained in the first light-emitting unit 1 by forming a layer of the energy transfer facilitating material on a surface of the red light-emitting layer 11. To contain the energy transfer facilitating material in the second light-emitting unit 2, the energy transfer facilitating material can be mixed in the yellow light-emitting layer 21. Otherwise, the energy transfer facilitating material can be contained in the second light-emitting unit 2 by forming a layer of the energy transfer facilitating material on a surface of the yellow light-emitting layer 21. In view of efficient energy transfer from the energy transfer facilitating material to the light-emitting material, a mixed structure is preferred to a layer structure because the mixed structure is likely to be shorter in distances between molecules than the layer structure.

In order to improve the luminous efficiency of the organic EL element 10, it is important to reduce absorption loss inside the organic EL element 10. Especially, the organic EL element 10 of the present embodiment has a triple unit layered structure, and therefore tends to be larger in a thickness of the light-emitting materials (organic materials) than a single unit or double unit structure. Generally, material which is the largest, in absorption with regard to a visible light region, of the light-emitting materials (organic materials) to be used is the red light-emitting material, and the material having the second largest absorption region is the yellow light-emitting material. The absorption caused by the light-emitting material depends on the content of the light-emitting material, and therefore it is important to reduce the content as much as possible. Simple decrease in the content may cause decrease in the luminous efficiency, the lifetime, and/or the like. Hence, the energy transfer facilitating material for facilitating efficient transfer of energy from a host material to the light-emitting material (the light-emitting dopant) is contained in the light-emitting unit 20, and thereby it is possible to maintain the luminous efficiency and the lifetime of the organic EL element 10 even when the content of the light-emitting material is reduced. As a result, it is possible to reduce absorption loss caused by the light-emitting material, and therefore improvement of the luminous efficiency of the organic EL element 10 can be facilitated.

As the energy transfer facilitating material, the first light-emitting unit 1 is preferred to contain the phosphorescent yellow light-emitting material. In this case, the phosphorescent yellow light-emitting material whose absorption range in the visible light region is narrower than that of the phosphorescent red light-emitting material is used as the energy transfer facilitating material, and therefore it is possible to reduce absorption within a visible light region by the first light-emitting unit 1 and to facilitate improvement of the luminous efficiency of the organic EL element 10. The second light-emitting unit 2 is preferred to contain a phosphorescent green light-emitting material as the energy transfer facilitating material. In this case, the phosphorescent green light-emitting material whose absorption range in the visible light region is narrower than that of the phosphorescent yellow light-emitting material as the energy transfer facilitating material, and therefore it is possible to reduce absorption within a visible light region by the second light-emitting unit 2 and to facilitate improvement of the luminous efficiency of the organic EL element 10.

The organic EL element 10 contains the energy transfer facilitating material preferably at an amount of 1 to 100 times as much as the light-emitting material, preferably at an amount of 5 to 100 times as much as the light-emitting material, and more preferably at an amount of 10 to 100 times as much as the light-emitting material. When a content of the energy transfer facilitating material is made to be greater than the content of the light-emitting material, it is possible to reduce absorption loss in the visible light region efficiently, and to facilitate improvement of the luminous efficiency of the organic EL element 10.

The phosphorescent red light-emitting material (phosphorescent red light-emitting dopant) may be $Btp_2Ir(acac)$, $Ir(piq)_3$, $Ir(piq)_2(acac)$, or PtOEP. The phosphorescent yellow light-emitting material (phosphorescent yellow light-emitting dopant) may be $Pq_2Ir(acac)$, or $thp_2Ir(acac)$. A host material of the light-emitting layer 40 including one or more of these phosphorescent light-emitting materials may be CBP, CzTT, TCTA, mCP, or CDBP. A doping concentration of a phosphorescent light-emitting dopant may be in a range of 1% to 40% by mass. The fluorescent blue light-emitting material (fluorescent blue light-emitting dopant) may be TBP, BCzVBi, or perylene. A host material of the light-emitting layer 40 including one or more of the fluorescent light-emitting materials may be Alga, ADN, BDAF, or TBADN. Further, a fluorescent light-emitting layer 40 is preferred to contain an electric charge movement assisting dopant which may be NPD, TPD, or Spiro-TAD, for example. A total doping concentration of the light-emitting dopant and the electric charge movement assisting dopant may be in a range of 1% to 30% by mass.

The light-emitting unit 20 may include, in addition to the light-emitting layer 40, one or more appropriate layers for facilitating operation of the organic EL element 10. The one or more appropriate layers may be exemplified by a charge transport layer 9. The charge transport layer 9 may be a layer for injecting or transporting holes or electrons. Main examples of the charge transport layer 9 include an electron transport layer 9a and a hole transport layer 9b. In the light-emitting unit 20, it is preferable that the hole transport layer 9b is disposed on a side, close to an anode (e.g., the first electrode 7), of the light-emitting layer 40, and the electron transport layer 9a is disposed on a side, close to a cathode (e.g., the second electrode 8), of the light-emitting layer 40. Note that, it may not be required that one or more charge transport layers 9 is disposed in one or more appropriate positions so long as a desired light emission can be obtained even when the light-emitting layer 40 is in direct contact with the first electrode 7 or the second electrode 8, or when the light-emitting layer 40 is in direct contact with the first interlayer 4 or the second interlayer 5. Further, examples of the charge transport layer 9 may include appropriate layers such as a hole injection layer or an electron injection layer. The hole injection layer can be formed on a side, close to the anode, of the hole transport layer 9b. The electron injection layer can be formed on a side, close to the cathode, of the electron transport layer 9a.

The hole injection layer may be made of CuPc, MTDATA, TiOPC, or HAT-CN6. Further, the hole injection layer may be made of a hole transport organic material doped with an acceptor. This acceptor may be exemplified by $MoO_3$, $V_2O_5$, and F4TCNQ.

The hole transport layer 9b may be made of TPD, NPD, TPAC, DTASi, or a triarylamine-based compound.

The electron transport layer 9a may be made of BCP, TAZ, BAlq, $Alq_3$, OXD7, or PBD.

The electron injection layer may be made of a metal compound (e.g., fluoride, oxide, or carbonate of alkaline metal or alkaline earth metal) such as UK $Li_2O$, MgO, or $Li_2CO_3$. Further, the electron injection layer may be a layer formed by doping an organic layer with metal (e.g., alkaline metal and alkaline earth metal) such as lithium, sodium, cesium and calcium.

The first interlayer 4 serving as the interlayer 30 may be formed as a layer having a function of injecting charges into the first light-emitting unit 1 and the second light-emitting unit 2 which are adjacent to the first interlayer 4. The second interlayer 5 serving as the interlayer 30 may be formed as a layer having a function of injecting charges into the second light-emitting unit 2 and the third light-emitting unit 3 which are adjacent to the second interlayer 5. By providing the interlayers 30, it is possible to allow the first light-emitting unit 1, the second light-emitting unit 2, and the third light-emitting unit 3 to emit light satisfactorily. Each interlayer 30 is also referred to as a charge generating layer since it is capable of performing a function of an electrode. Each interlayer 30 may have a function of injecting electrons toward an anode and injecting holes toward a cathode. For example, when the first electrode 7 serves as the anode and the second electrode 8 serves as the cathode, the first interlayer 4 may have a function of injecting electrons into the first light-emitting unit 1 which is adjacent to a side, close to the first electrode 7, of the first interlayer 4 and also has a function of injecting holes into the second light-emitting unit 2 which is adjacent to a side, close to the second electrode 8, of the first interlayer 4. Further in this case, the second interlayer 5 may have a function of injecting electrons into the second light-emitting unit 2 which is adjacent to a side, close to the first electrode 7, of the second interlayer 5 and also has a function of injecting holes into the third light-emitting unit 3 which is adjacent to a side, close to the second electrode 8, of the second interlayer 5. In a case where the organic EL element 10 includes at least one light-emitting unit in addition to the first light-emitting unit 1, the second light-emitting unit 2, and the third light-emitting unit 3, it is preferable that the at least one further light-emitting unit is also placed such that at least one further interlayer 30 which is different from the first interlayer 4 and the second interlayer 5 is interposed between the at least one further light-emitting unit and another light-emitting unit.

The interlayer 30 may be made of BCP:Li, ITO, NPD:MoO$_3$, or Liq:Al. For example, the interlayer 30 may have a double layer structure including a first layer of BCP:Li close to the anode and a second layer of ITO close to the cathode. Further, the interlayer 30 may be made of a metal thin film. The metal this film can transmit light. For example, the interlayer 30 may be made of Ag or Al.

Note that, in the present embodiment, CBP represents 4,4'-N,N'-dicarbazolebiphenyl. Further, Alq$_3$ represents tris-(8-oxoquinoline)aluminum (III). Further, TBADN represents 2-t-butyl-9,10-di(2-naphthyl)anthracene. Further, Ir(ppy)$_3$ represents fac-tris(2-phenylpyridine)iridium. Further, Btp$_2$Ir(acac) represents bis-(3-(2-(2-pyridyl)benzothienyl)mono-acetylacetonate)iridium(III)). Further, C545T means coumarinC545T, and represents 10-2-(benzothiazolyl)-2,3,6,7-tetrahydro-1,1,7,7-tetramethyl-1H,5H,11H-(1)benzopyropyrano(6,7,-8-ij)quinolizin-11-one. Further, TBP represents 1-tert-butyl-perylene. Further, NPD represents 4,4'-bis[N-(naphthyl)-N-phenyl-amino]biphenyl. Further, BCP represents 2,9-dimethyl-4,7-diphenyl-1,10-phenanthroline. Further, CuPc represents copper phthalocyanine. Further, TPD represents N,N'-bis(3-methylphenyl)-(1,1'-biphenyl)-4,4'-diamine.

The substrate 6 may be formed in a flat plate shape. When the substrate 6 serves as a supporting substrate, a light-emitting stack which is a stack including the first electrode 7, the second electrode 8, and intermediates between the first electrode 7 and the second electrode 8 is formed on a surface of the substrate 6. When the organic EL element 10 has a bottom emission structure which allows light to emerge from the substrate 6, it is preferable that the first electrode 7 and the substrate 6 have a light transmitting property, and it is more preferable that the second electrode 8 has a light reflecting property. Thus, it is possible to extract light to the outside through the first electrode 7 and the substrate 6. When the organic EL element 10 has a top emission structure which allows light to emerge from an opposite side of the light-emitting stack from the substrate 6, it is preferable that the second electrode 8 has a light transmitting property, and it is more preferable that the first electrode 7 has a light reflecting property. In this case, the substrate 6 may be or may not be transparent. When the first electrode 7 has a light transmitting property, it is preferable that the substrate 6 has a light reflecting property. The organic EL element 10 having the bottom emission structure which includes a light-transmissive electrode on the surface of the substrate 6 is advantageous to use in a light-emitting device for lighting.

The substrate 6 may be made of an appropriate substrate material which is suitable for forming the organic EL element 10. For example, the substrate 6 may be made of a glass substrate or a resin substrate. In a case of using the glass substrate, it is possible to easily obtain a transparent substrate that has a high light extraction property and high strength.

The first electrode 7 and the second electrode 8 may be made of an appropriate electrically conductive material. It is preferable that one of the first electrode 7 and the second electrode 8 is formed as a light-transmissive electrode and the other is formed as a light-reflective electrode, to allow light to emerge from the first light-emitting unit 1, the second light-emitting unit 2, and the third light-emitting unit 3. Further, both of the first electrode 7 and the second electrode 8 may be formed as light-transmissive electrodes.

One of the first electrode 7 and the second electrode 8 may be formed as the anode and the other may be formed as the cathode. That is, the first electrode 7 may serve as the anode while the second electrode 8 may serve as the cathode, and alternatively, the first electrode 7 may serve as the cathode while the second electrode 8 may serve as the anode.

It is preferable that the anode is made of an electrode material having a large work function, such as a metal, an alloy, an electric conductive compound, and a mixture of these. When extracting light from the anode, the anode may be formed of a transparent conductive film. Examples of the anode may include a metal thin film, a transparent metal oxide film, and an organic conductive film. The material of the anode may be selected from metal (e.g., gold), CuI, ITO (Indium Tin Oxide), SnO$_2$, ZnO. IZO (Indium Zinc Oxide), an electrically conductive polymer (e.g., PEDOT and polyaniline), an electrically conductive polymer doped with an arbitrary acceptor, and an electrically conductive light-transmissive material (e.g., a carbon nanotube), for example. It is possible to form a transparent electrode having high conductivity by use of ITO or the like. Further, it is preferable that the cathode is made of an electrode material having a small work function, such as a metal, an alloy, an electric conductive compound, and a mixture of these.

The material of the cathode may be selected from metal such as alkaline metal, alkaline earth metal, and an alloy of this metal and other metal. In more detail, the material of the cathode may be aluminum, silver, sodium, an alloy of sodium and potassium, lithium, magnesium, a mixture of magnesium and silver, a mixture of magnesium and indium, and an alloy of aluminum and lithium, for example. Further, the cathode may include one layer or multiple stacked layers of electrically conductive material such as metal. For example, the cathode may be a stack of layers of alkaline metal and Al, a stack of layers of alkaline earth metal and Al, a stack of layers of alkaline earth metal and Ag, or a stack of layers of a magnesium-silver alloy and Ag. It is possible to form an electrode having high reflectivity by use of aluminum or silver.

The first electrode 7 and the second electrode 8 may have a thickness in a range of about 10 nm to 300 nm, for example. A distance between the first electrode 7 and the second electrode 8 may be in a range of about 10 nm to 1,000 nm, for example, and may preferably be in a range of about 50 nm to 500 nm.

Second Embodiment

Figure 5:
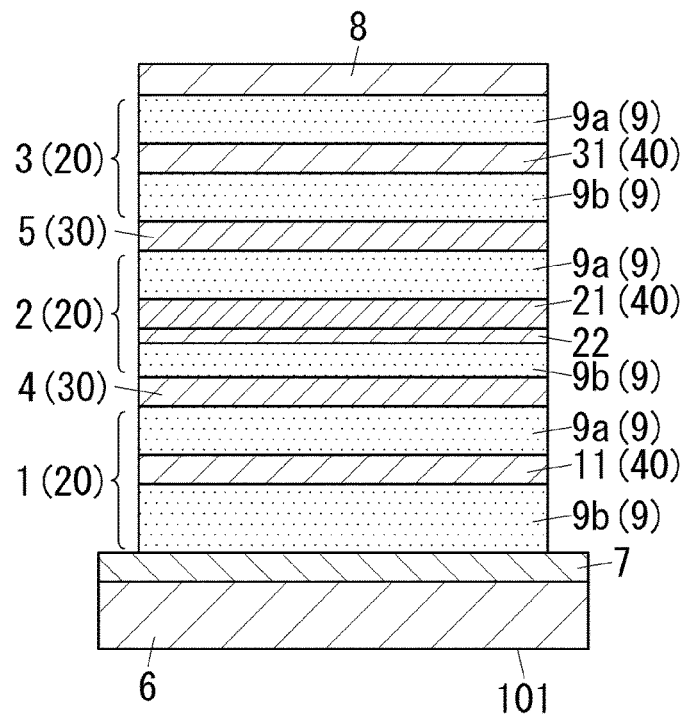
FIG. 5 is a schematic sectional view illustrating an example of another embodiment of the present invention.

FIG. 5 shows an example of an organic EL element 101 of the second embodiment. This organic EL element 101 is different from the first embodiment in a structure of a second light-emitting unit 2. The second embodiment and the first embodiment are the same in components other than the second light-emitting unit 2. The same components as the first embodiment shown in FIG. 1 are attached with the same reference signs, and therefore descriptions thereof will be omitted from the following explanation made to the second embodiment.

The second light-emitting unit 2 mentioned above is formed to contain a red light-emitting material. This red light-emitting material is provided in a form of a layer which is on a surface, close to the first electrode 7, of the yellow light-emitting layer 21 and defines a red auxiliary light-emitting layer 22. This red auxiliary light-emitting layer 22 can contribute to minor adjustment of an emission color of the organic EL element 101.

As a result of including the red light-emitting material in the second light-emitting unit 2 as mentioned above, the second light-emitting unit 2 contains the red light-emitting material that is smaller in energy necessary for emitting light than a phosphorescent yellow light-emitting material of the yellow light-emitting layer 21, which is a main light-emitting material in the second light-emitting unit 2. Thus, it is possible to prevent minor adjustment of the emission color from causing increase in a driving voltage. Note that, since the yellow light-emitting layer 21 is made of the phosphorescent yellow light-emitting material, it is preferable that the red auxiliary light-emitting layer 22 is also made of a phosphorescent red light-emitting material which is one type of phosphorescent light-emitting materials like the phosphorescent yellow light-emitting material. Thus, both of the yellow light-emitting layer 21 and the red auxiliary light-emitting layer 22 are formed of the phosphorescent light-emitting materials and contained in the same light-emitting unit 20, and thereby it is possible to maintain the high luminous efficiency of the organic EL element 101 without adopting a complicated structure or using special materials. It is preferable that examples of the phosphorescent red light-emitting material for forming the red auxiliary light-emitting layer 22 may include materials exemplifying the phosphorescent red light-emitting material of the red light-emitting layer 11 of the first light-emitting unit 1 of the first embodiment.

Note that, to make the second light-emitting unit 2 contain the red light-emitting material, the red light-emitting material may be mixed in the yellow light-emitting layer 21 by blending the red light-emitting material with material of the yellow light-emitting layer 21.

Third Embodiment

Figure 6:
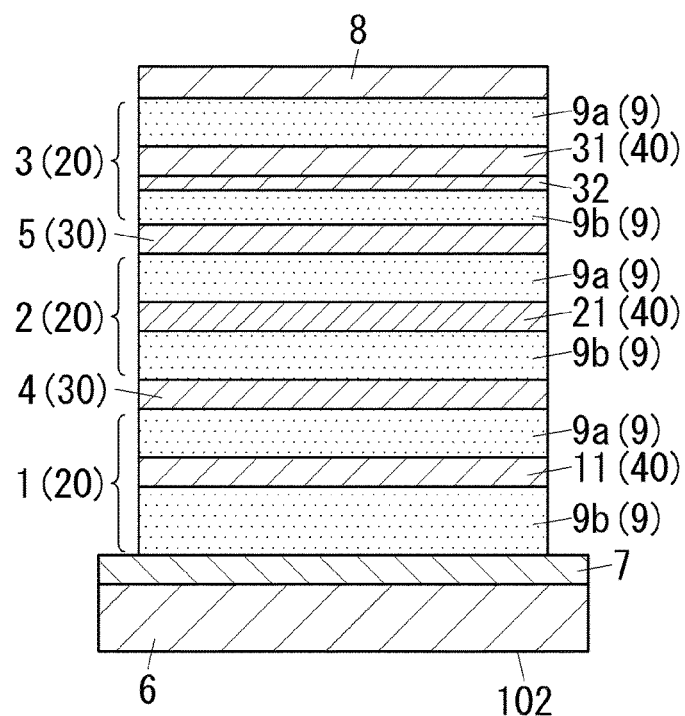
FIG. 6 is a schematic sectional view illustrating an example of another embodiment of the present invention.

FIG. 6 shows an example of an organic EL element 102 of the third embodiment. This organic EL element 102 is different from the first embodiment in a structure of the third light-emitting unit 3. The first embodiment and the third embodiment are the same in components other than the third light-emitting unit 3. The same components as the first embodiment shown in FIG. 1 are attached with the same reference signs, and therefore descriptions thereof will be omitted from the following explanation made to the third embodiment.

The third light-emitting unit 3 mentioned above is formed to contain a red light-emitting material. This red light-emitting material is provided in a form of a layer which is on a surface, close to the first electrode 7, of the blue light-emitting layer 31 and defines a red auxiliary light-emitting layer 32. This red auxiliary light-emitting layer 32 can contribute to minor adjustment of an emission color of the organic EL element 102.

As a result of including the red light-emitting material in the third light-emitting unit 3 as mentioned above, the third light-emitting unit 3 contains the red light-emitting material that is smaller in energy necessary for emitting light than a fluorescent blue light-emitting material of the blue light-emitting layer 31, which is a main light-emitting material in the third light-emitting unit 3. Thus, it is possible to prevent minor adjustment of the emission color from causing increase in a driving voltage. Note that, since the blue light-emitting layer 31 is made of the fluorescent blue light-emitting material, it is preferable that the red auxiliary light-emitting layer 32 is also made of a fluorescent red light-emitting material which is one type of fluorescent light-emitting materials like the fluorescent blue light-emitting material. Thus, both of the blue light-emitting layer 31 and the red auxiliary light-emitting layer 32 are formed of the fluorescent light-emitting materials and contained in the same light-emitting unit 20, and thereby it is possible to maintain the high luminous efficiency of the organic EL element 102 without adopting a complicated structure or using special materials. Especially, adding the red light-emitting material into the third light-emitting unit 3 is effective to adjustment of color temperatures which is important to lighting applications. The fluorescent red light-emitting material (a fluorescent red light-emitting dopant) may be DCJTB or the like.

Note that, to make the third light-emitting unit 3 contain the red light-emitting material, the red light-emitting material may be mixed in the blue light-emitting layer 31 by blending the red light-emitting material with material of the blue light-emitting layer 31.

The organic EL elements 10 according to the present embodiments have following features.

The organic EL element 10 has a structure in which the first light-emitting unit 1 containing the phosphorescent red light-emitting material, the second light-emitting unit 2 containing the phosphorescent yellow light-emitting material, and the third light-emitting unit 3 containing the fluorescent blue light-emitting material are stacked with interlayers 30 in-between. The peak emission wavelength of the phosphorescent yellow light-emitting material is in the range of 530 nm to 570 nm, and the peak emission wavelength of the fluorescent blue light-emitting material is in the range of 440 nm to 480 nm. The organic EL element 10 has the ratio of the yellow emission intensity to the blue emission intensity in the range of 1.0 to 2.0. The organic EL element 10 further has the ratio of the red emission intensity to the blue emission intensity in the range of 1.5 to 3.0. In the aforementioned organic EL element 10, one fluorescent light-emitting layer is combined with two phosphorescent light-emitting layers, and this leads to increase in a ratio of a phosphorescence emission to a fluorescence emission. Thereby, it is possible to improve the luminous efficiency. Further, the peak emission wavelength of the phosphorescent yellow light-emitting material and the peak emission wavelength of the fluorescent blue light-emitting material are set to fall within the corresponding above prescribed ranges, and therefore it is possible to realize a white light emission without purposely suppressing luminous efficiency of each color. Furthermore, the ratio of the yellow emission intensity to the blue emission intensity and the ratio of the red emission intensity to the blue emission intensity are set to fall within the corresponding above prescribed ranges, and therefore it is possible to easily achieve a white light emission suitable for lighting applications.

In the organic EL element 10, it is preferable that the second light-emitting unit 2 or the third light-emitting unit 3 contains the red light-emitting material. In this case, the second light-emitting unit 2 or the third light-emitting unit 3 contains the red light-emitting material that is smaller in energy necessary for emitting light than the phosphorescent yellow light-emitting material of the yellow light-emitting layer 21 and the fluorescent blue light-emitting material of the blue light-emitting layer 31, which are main light-emitting materials in the second light-emitting unit 2 and the third light-emitting unit 3, respectively. Therefore, minor adjustment of the emission color can be prevented from causing increase in the driving voltage of the organic EL element 10.

Further in the organic EL element 10, it is preferable that the first light-emitting unit 1 contains only the phosphorescent red light-emitting material as the light-emitting dopant. In this case, the light-emitting dopant is only the red light-emitting material that is the smallest, in energy necessary for emitting light, of the red, yellow, and blue light-emitting materials, and therefore the organic EL element 10 can operate with lower voltage.

Further in the organic EL element 10, it is preferable that at least one of the first light-emitting unit 1 and the second light-emitting unit 2 contains the energy transfer facilitating material for facilitating transfer of energy to the light-emitting material. In this case, it is possible to maintain the luminous efficiency and the lifetime of the organic EL element 10 even when the content of the light-emitting material in the first light-emitting unit 1 or the second light-emitting unit 2 is reduced. As a result, it becomes possible to reduce absorption loss caused by the light-emitting material, and to facilitate improvement of the luminous efficiency of the organic EL element 10.

Further in the organic EL element 10, it is preferable that the first light-emitting unit 1 contains the phosphorescent yellow light-emitting material as the energy transfer facilitating material. In this case, the phosphorescent yellow light-emitting material whose absorption range in the visible light region is narrower than that of the phosphorescent red light-emitting material is used as the energy transfer facilitating material, and therefore it is possible to reduce absorption of light in the visible light region caused by the first light-emitting unit 1. Consequently it is possible to facilitate improvement of the luminous efficiency of the organic EL element 10.

EXAMPLES

Hereinafter, the present invention will be specifically described by way of examples.

Example 1

Example 1 was produced to have the same structure as the organic EL element 10 shown in FIG. 1.

The substrate 6 was made of a glass substrate of 0.7 mm thickness.

The first electrode 7 was made of ITO, and formed on the surface of the substrate 6 so as to have a thickness of 150 nm.

The hole transport layer 9b of the first light-emitting unit 1 was made of NPD, and formed on the surface of the first electrode 7 so as to have a thickness of 50 nm.

The red light-emitting layer 11 of the first light-emitting unit 1 was made of the phosphorescent red light-emitting material which was $Ir(piq)_2(acac)$ (the peak emission wavelength: 625 nm), and formed on the surface of the hole transport layer 9b of the first light-emitting unit 1 so as to have a thickness of 30 nm.

The electron transport layer 9a of the first light-emitting unit 1 was made of $Alq_3$, and formed on the surface of the red light-emitting layer 11 so as to have a thickness of 30 nm.

The first interlayer 4 was made of $Alq_3:Li/ITO/MoO_3$, and formed on the surface of the electron transport layer 9a of the first light-emitting unit 1 so as to have a thickness of 10 nm.

The hole transport layer 9b of the second light-emitting unit 2 was made of NPD, and formed on the surface of the first interlayer 4 so as to have a thickness of 50 nm.

The yellow light-emitting layer 21 of the second light-emitting unit 2 was made of the phosphorescent yellow light-emitting material which was $Bt_2Ir(acac)$ (the peak emission wavelength: 570 nm), and formed on the surface of the hole transport layer 9b of the second light-emitting unit 2 so as to have a thickness of 40 nm.

The electron transport layer 9a of the second light-emitting unit 2 was made of $Alq_3$, and formed on the surface of the yellow light-emitting layer 21 so as to have a thickness of 30 nm.

The second interlayer 5 was made of $Alq_3:Li/ITO/MoO_3$, and formed on the surface of the electron transport layer 9a of the second light-emitting unit 2 so as to have a thickness of 10 nm.

The hole transport layer 9b of the third light-emitting unit 3 was made of NPD, and formed on the surface of the second interlayer 5 so as to have a thickness of 50 nm.

The blue light-emitting layer 31 of the third light-emitting unit 3 was made of the fluorescent blue light-emitting material which was TBP (the peak emission wavelength: 455 nm), and formed on the surface of the hole transport layer 9b of the third light-emitting unit 3 so as to have a thickness of 40 nm.

The electron transport layer 9a of the third light-emitting unit 3 was made of $Alq_3$, and formed on the surface of the blue light-emitting layer 31 so as to have a thickness of 50 nm.

The second electrode 8 was made of Al, and formed on the surface of the electron transport layer 9a of the second light-emitting unit 2 so as to have a thickness of 90 nm.

Example 2

Example 2 was produced to have the same structure as the organic EL element 101 shown in FIG. 5.

The red auxiliary light-emitting layer 22 provided in the second light-emitting unit 2 was made of the phosphorescent red light-emitting material being $Ir(piq)_2(acac)$ (the peak emission wavelength: 625 nm), and formed between the hole transport layer 9b and the yellow light-emitting layer 21 in the second light-emitting unit 2 so as to have a thickness of 10 nm. The other components of Example 2 are same as those in Example 1.

Example 3

Example 3 was produced to have the same structure as the organic EL element 102 shown in FIG. 6.

The red auxiliary light-emitting layer 32 provided in the third light-emitting unit 3 was made of the phosphorescent red light-emitting material being Ir(piq)$_2$(acac) (the peak emission wavelength: 625 nm), and formed between the hole transport layer 9b and the blue light-emitting layer 31 in the third light-emitting unit 3 so as to have a thickness of 7 nm. The other components of Example 3 are same as those in Example 1.

Example 4

Bt$_2$Ir(acac) (the peak emission wavelength: 570 nm) was used as the phosphorescent yellow light-emitting material serving as the energy transfer facilitating material. This energy transfer facilitating material was mixed into the red light-emitting layer 11 of the first light-emitting unit 1 so that a ratio of the energy transfer facilitating material in the red light-emitting layer 11 was 20%. The other components of Example 4 are same as those in Example 1.

Example 5

Ir(ppy)$_3$ was used as the energy transfer facilitating material. This energy transfer facilitating material was mixed into the yellow light-emitting layer 21 of the second light-emitting unit 2 so that a ratio of the energy transfer facilitating material in the yellow light-emitting layer 21 was 20%. The other components of Example 5 are same as those in Example 1.

Comparative Example 1

With regard to the red light-emitting layer 11, the fluorescent red light-emitting material was used instead of the phosphorescent red light-emitting material. DCJT was used as the fluorescent red light-emitting material. The other components of Comparative Example 1 are same as those in Example 1.

Comparative Example 2

With regard to the yellow light-emitting layer 21, the fluorescent yellow light-emitting material was used instead of the phosphorescent yellow light-emitting material. TTPA was used as the fluorescent yellow light-emitting material. The other components of Comparative Example 2 are same as those in Example 1.

Comparative Example 3

The yellow light-emitting layer 21 was made of Ir(ppy)$_3$ (the peak emission wavelength: 515 nm) serving as the phosphorescent yellow light-emitting material whose peak emission wavelength was not within the range of 530 nm to 570 nm. The other components of Comparative Example 3 are same as those in Example 1.

Comparative Example 4

The blue light-emitting layer 31 was made of DSA-Ph (the peak emission wavelength: 489 nm) serving as the fluorescent blue light-emitting material whose peak emission wavelength was not within the range of 440 nm to 480 nm. The other components of Comparative Example 4 are same as those in Example 1.

Comparative Example 5

In order to realize the white light emission by using the same materials as Comparative Example 3, the phosphorescent yellow emission intensity and the phosphorescent red emission intensity were adjusted by changing the ratios of the light-emitting materials. The other components of Comparative Example 5 are same as those in Example 1.

Comparative Example 6

In order to realize the white light emission by using the same materials as Comparative Example 4, the phosphorescent yellow emission intensity and the phosphorescent red emission intensity were adjusted by changing the ratios of the light-emitting materials. The other components of Comparative Example 6 are same as those in Example 1.

With regard to each of above Examples and Comparative Examples, the ratio of the yellow emission intensity to the blue emission intensity and the ratio of the red emission intensity to the blue emission intensity were calculated. These ratios of intensities were calculated from the emission peak intensities derived from the total luminous flux spectrums measured with an integrating sphere from the emission spectrums obtained when current was supplied at 4 mA/cm$^2$.

Further, with regard to each of above Examples and Comparative Examples, the luminous efficiency was calculated. Each luminous efficiency was calculated based on a formula of the luminous efficiency=the total luminous flux supplied power, wherein the total luminous flux was measured with an integrating sphere from the emission spectrums obtained when current was supplied at 4 mA/cm$^2$. Table 1 shows relative values of the luminous efficiency calculated so that the luminous efficiency of Example 1 is equal to 1.

Further, with regard to each of above Examples and Comparative Examples, the driving voltage was calculated. Each driving voltage corresponds to a driving voltage measured with a source meter (KEITHLEY 2410) when current was supplied at 4 mA/cm$^2$.

Further, with regard to each of above Examples and Comparative Examples, the color rendering property was calculated. Each color rendering property was calculated from the total luminous flux spectrum measured with an integrating sphere from the emission spectrums obtained when current was supplied at 4 mA/cm$^2$.

Further, with regard to each of above Examples and Comparative Examples, it was observed whether the chromaticity of the light emission fell within the white color region.

Results are summarized in Table 1.

TABLE 1

| | Yellow emission intensity/ Blue emission intensity | Red emission intensity/ Blue emission intensity | Luminous efficiency | Driving voltage (V) | Color rendering property | White light emission |
|---|---|---|---|---|---|---|
| Example 1 | 1.6 | 2.2 | 1.00 | 8.8 | 85 | OK |
| Example 2 | 1.4 | 2.5 | 0.98 | 8.8 | 87 | OK |
| Example 3 | 1.8 | 2.8 | 1.01 | 8.8 | 86 | OK |
| Example 4 | 1.6 | 2.2 | 1.09 | 8.9 | 85 | OK |
| Example 5 | 1.6 | 2.2 | 1.06 | 8.9 | 85 | OK |
| Comparative Example 1 | 1.6 | 1.3 | 0.85 | 8.8 | 73 | NG |
| Comparative Example 2 | 0.7 | 1.9 | 0.61 | 8.8 | 76 | NG |
| Comparative Example 3 | 1.8 | 1.8 | 0.95 | 8.8 | 77 | NG |

TABLE 1-continued

| | Yellow emission intensity/ Blue emission intensity | Red emission intensity/ Blue emission intensity | Luminous efficiency | Driving voltage (V) | Color rendering property | White light emission |
|---|---|---|---|---|---|---|
| Comparative Example 4 | 1.7 | 2.0 | 1.05 | 8.8 | 71 | NG |
| Comparative Example 5 | 1.6 | 2.2 | 0.80 | 8.8 | 73 | OK |
| Comparative Example 6 | 1.6 | 2.3 | 0.73 | 8.8 | 69 | OK |

REFERENCE SIGNS LIST 10, 101, 102 Organic electroluminescent element
30 Interlayer
1 First light-emitting unit
2 Second light-emitting unit
3 Third light-emitting unit

The invention claimed is:

1. An organic electroluminescent element comprising a structure comprising:
    a first light-emitting unit containing a phosphorescent red light-emitting material;
    a second light-emitting unit containing a phosphorescent yellow light-emitting material;
    a third light-emitting unit containing a fluorescent blue light-emitting material; and
    an interlayer comprising:
        a first interlayer provided between the first light-emitting unit and the second light-emitting unit; and
        a second interlayer provided between the second light-emitting unit and the third light-emitting unit, wherein:
    the first interlayer is configured to inject charges into the first light-emitting unit and the second light-emitting unit,
    the second interlayer is configured to inject charges into the second light-emitting unit and the third light-emitting unit,
    a peak emission wavelength of the phosphorescent yellow light-emitting material is in a range of 530 nm to 570 nm,
    a peak emission wavelength of the fluorescent blue light-emitting material is in a range of 440 nm to 480 nm,
    the organic electroluminescent element having a ratio of a yellow emission intensity to a blue emission intensity is in a range of 1.0 to 2.0,
    the organic electroluminescent element has a ratio of a red emission intensity to the blue emission intensity in a range of 1.5 to 3.0, and
    the first light-emitting unit contains only the phosphorescent red light-emitting material as a light-emitting dopant.

2. The organic electroluminescent element according to claim 1, wherein at least one of the second light-emitting unit and the third light-emitting unit contains a red light-emitting material.

3. The organic electroluminescent element according to claim 1, wherein at least one of the first light-emitting unit and the second light-emitting unit contains an energy transfer facilitating material for facilitating transfer of energy to a light-emitting material.

4. The organic electroluminescent element according to claim 3, wherein the first light-emitting unit contains a phosphorescent yellow light-emitting material as the energy transfer facilitating material.

* * * * *